US 12,402,255 B2

(12) United States Patent
Okamura et al.

(10) Patent No.: US 12,402,255 B2
(45) Date of Patent: Aug. 26, 2025

(54) METHOD FOR PRODUCING ELECTRONIC COMPONENT MOUNTED SUBSTRATE

(71) Applicant: Panasonic Intellectual Property Management Co., Ltd., Kadoma (JP)

(72) Inventors: Shingo Okamura, Fukuoka (JP); Tadashi Maeda, Fukuoka (JP); Yuki Yoshioka, Fukuoka (JP); Tadahiko Sakai, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 17 days.

(21) Appl. No.: 18/565,172

(22) PCT Filed: Feb. 21, 2022

(86) PCT No.: PCT/JP2022/006966
§ 371 (c)(1),
(2) Date: Nov. 29, 2023

(87) PCT Pub. No.: WO2022/254819
PCT Pub. Date: Dec. 8, 2022

(65) Prior Publication Data
US 2024/0268036 A1    Aug. 8, 2024

(30) Foreign Application Priority Data
Jun. 3, 2021   (JP) ................. 2021-093900

(51) Int. Cl.
*B23K 1/00*     (2006.01)
*B23K 1/20*     (2006.01)
(Continued)

(52) U.S. Cl.
CPC ......... *H05K 3/3442* (2013.01); *B23K 1/0016* (2013.01); *B23K 1/20* (2013.01);
(Continued)

(58) Field of Classification Search
CPC .. B23K 1/203; B23K 2101/40; B23K 3/0623; H01L 21/563; H01L 2924/014;
(Continued)

(56) References Cited

U.S. PATENT DOCUMENTS

| 6,209,196 B1 * | 4/2001 | Ozono | H01L 24/29 29/877 |
| 6,513,236 B2 * | 2/2003 | Tsukamoto | H01L 21/563 228/6.2 |

(Continued)

FOREIGN PATENT DOCUMENTS

| JP | S61-181883 A | 8/1986 |
| JP | H01-150493 A | 6/1989 |

(Continued)

OTHER PUBLICATIONS

JPH10-215058A computer English translation (Year: 2025).*

(Continued)

*Primary Examiner* — Erin B Saad
(74) *Attorney, Agent, or Firm* — MCDONALD HOPKINS LLC

(57) ABSTRACT

A disclosed method for manufacturing an electronic-component-mounted substrate includes: a step (i) of forming a temporary fixing film (13) in such a manner as to cover a plurality of solder precoats (11) formed on a plurality of lands (10b) on a substrate and an antioxidation film (12) formed in such a manner as to cover the solder precoats; a step (ii) of disposing a plurality of electronic components (30) on the plurality of solder precoats (11) via the antioxidation film (12) and the temporary fixing film (13); and a step (iii) of soldering the plurality of electronic components (30) to the lands (10b) by melting the plurality of solder precoats (11). The antioxidation film (12) contains a first thermoplastic resin. The temporary fixing film (13) contains an activating agent and a second thermoplastic resin. The (Continued)

softening point of the first thermoplastic resin is equal to or lower than the softening point of the second thermoplastic resin.

4 Claims, 6 Drawing Sheets

(51) Int. Cl.
 *H05K 3/34* (2006.01)
 *B23K 101/42* (2006.01)
(52) U.S. Cl.
 CPC ......... *H05K 3/3485* (2020.08); *H05K 3/3489* (2013.01); *B23K 2101/42* (2018.08); *H05K 2203/0445* (2013.01)
(58) Field of Classification Search
 CPC ........... H01L 2224/16225; H05K 2201/10977; H05K 3/284; H05K 2203/1316; H05K 3/305; H05K 3/303
 See application file for complete search history.

(56) References Cited

U.S. PATENT DOCUMENTS

| | | | | |
|---|---|---|---|---|
| 6,578,755 B1* | 6/2003 | Elenius | ................ | H05K 3/3436 |
| | | | | 228/123.1 |
| 6,648,213 B1* | 11/2003 | Patterson | ................ | H01L 24/29 |
| | | | | 257/E21.511 |
| 6,998,293 B2* | 2/2006 | Achari | .................... | H01L 24/13 |
| | | | | 257/E23.068 |
| 7,327,039 B2* | 2/2008 | Charles | ................. | H01L 23/295 |
| | | | | 257/E21.503 |
| 7,338,842 B2* | 3/2008 | Chaware | ............... | H01L 21/563 |
| | | | | 257/E21.511 |
| 8,258,637 B2* | 9/2012 | Sakamoto | ......... | H01L 23/49816 |
| | | | | 257/737 |
| 9,627,229 B2* | 4/2017 | Lan | ......................... | H01L 23/13 |
| 9,947,466 B2* | 4/2018 | Hattori | ................... | H01G 2/065 |
| 10,262,970 B2* | 4/2019 | Interrante | ............ | H05K 3/3494 |

FOREIGN PATENT DOCUMENTS

| | | |
|---|---|---|
| JP | H06-090078 A | 3/1994 |
| JP | H06-090079 A | 3/1994 |
| JP | H07-183650 A | 7/1995 |
| JP | H08-288638 A | 11/1996 |
| JP | H10-215058 A | 8/1998 |
| JP | H11-214441 A | 8/1999 |
| JP | 2004-047772 A | 2/2004 |

OTHER PUBLICATIONS

JPH01-150493A computer English translation (Year: 2025).*
International Search Report issued in Patent Application No. PCT/JP2022/006966 dated May 24, 2022.
Japanese Office Action issued in Japanese Patent Application No. 2023-525392 dated May 14, 2024.

* cited by examiner

METHOD FOR PRODUCING ELECTRONIC COMPONENT MOUNTED SUBSTRATE

TECHNICAL FIELD

The present invention relates to a method for manufacturing an electronic-component-mounted substrate.

BACKGROUND ART

A reflow method is known as a method for soldering a plurality of electronic components to a substrate. In the reflow method, electronic components are soldered with use of a solder precoat formed on the substrate in advance.

PTL 1 (Japanese Laid-Open Patent Publication No. H6 (1994)-90079) proposes "a method for mounting electronic components on a printed circuit board including: printing a solder paste (8) on pads (3) in a rough pitch pad section (4) of a printed circuit board (1) including a fine pitch pad section (5) in which a pad arrangement pitch is less than 0.5 mm and the rough pitch pad section (4) in which the pad arrangement pitch is 0.5 mm or more; then applying a solder precipitating composition (12) containing an organic acid lead salt and tin powder as main components over the entire fine pitch pad section (5); then heating the printed circuit board (1) to form a solder layer (13) on the pads (3) in the rough pitch pad section (4) by melting the solder paste (8) and to form a solder layer (13) on pads (3) in the fine pitch pad section (5) by causing solder to precipitate from the solder precipitating composition (12); then applying a flux (15) to the printed circuit board (1); mounting electronic components (16) on the printed circuit board (1) and temporarily fixing leads (17) to the solder layers (13) on the pads (3) with adhesive power of the flux (15); and heating the printed circuit board (1), on which the electronic components (16) have been mounted, to solder the leads (17) of the electronic components (16) to the pads (3) by melting the solder layers (13)." Paragraph 0026 of PTL 1 discloses that "it is preferable to clean the precoated substrate 14 with an alternative cleaning agent such as a surfactant-based cleaning agent, a higher alcohol-based solvent, or a terpene-based solvent, water, alternative CFC, or the like to remove a paste residue, a solder ball, and the like."

CITATION LIST

Patent Literature

PTL 1: Japanese Laid-Open Patent Publication No. H6 (1994)-90079

SUMMARY OF INVENTION

Technical Problem

In recent years, miniaturization of electronic components is progressing, and a distance between lands is reduced along with the miniaturization of electronic components. When a distance between lands is short, defects are likely to occur as a result of electronic components moving while being mounted.

Under the above circumstances, an object of the present invention is to provide a method for manufacturing an electronic-component-mounted substrate that can suppress the occurrence of soldering defects even when a distance between lands is short.

Solution to Problem

An aspect of the present invention relates to a method for manufacturing an electronic-component-mounted substrate. The method includes: a step (i) of forming a temporary fixing film in such a manner as to cover a plurality of solder precoats formed on a plurality of lands on a substrate and an antioxidation film formed in such a manner as to cover each of the plurality of solder precoats; a step (ii) of disposing a plurality of electronic components on the plurality of solder precoats via the antioxidation film and the temporary fixing film; and a step (iii) of soldering the plurality of electronic components to the plurality of lands by melting the plurality of solder precoats, wherein the antioxidation film contains a first thermoplastic resin, the temporary fixing film contains an activating agent and a second thermoplastic resin, and a softening point of the first thermoplastic resin is equal to or lower than a softening point of the second thermoplastic resin.

Advantageous Effects of Invention

With the method for manufacturing an electronic-component-mounted substrate according to the present invention, it is possible to suppress the occurrence of defects when electronic components are soldered.

Although novel features of the present invention are described in the appended claims, the following detailed description referring to the drawings will facilitate understanding of both the configuration and content of the present invention as well as other objects and features of the present invention.

DESCRIPTION OF EMBODIMENTS

Figure 1A:
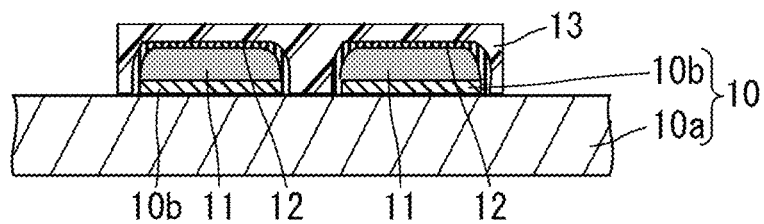
FIG. 1A is a cross-sectional view schematically showing a step in an example of a manufacturing method according to the present invention.

The following describes examples of embodiments of the present invention, but the present invention is not limited to the following examples. In the present specification, the wording "from a numerical value A to a numerical value B" means a range including the numerical values A and B and can be read as "the numerical value A or more and the numerical value B or less". In the following description, when examples of a lower limit value and examples of an upper limit value of a specific physical property, condition, or the like are described, any of the examples of the lower limit value and any of the examples of the upper limit value can be combined suitably unless the lower limit value is equal to or higher than the upper limit value.

(Method for Manufacturing Electronic-Component-Mounted Substrate)

A manufacturing method according to the present embodiment is a method for manufacturing an electronic-component-mounted substrate. Hereinafter, the manufacturing method may be referred to as a "manufacturing method (M)". The manufacturing method (M) includes a step (i), a step (ii), and a step (iii) in this order.

(Step (i))

The step (i) is a step of forming a temporary fixing film in such a manner as to cover a plurality of solder precoats formed on a plurality of lands on a substrate and an antioxidation film formed in such a manner as to cover each of the solder precoats. The antioxidation film contains a first thermoplastic resin. The temporary fixing film contains an activating agent and a second thermoplastic resin. The softening point of the first thermoplastic resin is equal to or lower than the softening point of the second thermoplastic resin. The antioxidation film and the temporary fixing film contain the thermoplastic resins, and accordingly, these films soften when heated.

The antioxidation film is formed in such a manner as to cover surfaces of the solder precoats. Therefore, the antioxidation film suppresses oxidation of the surfaces of the solder precoats. That is, the antioxidation film suppresses the occurrence of soldering defects due to oxidation of the surfaces of the solder precoats. It is possible to use a commercially-available substrate on which solder precoats are formed, as the substrate including the solder precoats formed thereon. Alternatively, the solder precoats may be formed on the lands of the substrate by using a method described later, for example.

The first thermoplastic resin contained in the antioxidation film is rosin or a modified rosin, for example. In the following description, rosin and modified rosins may be collectively referred to as "rosins". Examples of modified rosins include modified rosins described in Examples, but it is also possible to use other modified rosins, examples of which include natural rosins such as gum rosin and wood rosin, and derivatives thereof (e.g., a polymerized rosin, a hydrogenated rosin, a disproportionated rosin, an acid modified rosin, and a rosin ester). The softening point of a rosin can be changed by modifying the rosin. The antioxidation film may be a residue (a flux residue) formed on the surfaces of the solder precoats when the solder precoats are formed. In this case, a portion of a flux contained in a solder paste that is used to form the solder precoats forms the antioxidation film. In this case, a thermoplastic resin contained in the flux is the first thermoplastic resin contained in the antioxidation film. That is, a solder paste that contains the first thermoplastic resin is used in the case where a residue of the solder paste is used as the antioxidation film.

The temporary fixing film temporarily and stably fixes electronic components disposed on the solder precoats until reflow is performed. The use of the temporary fixing film makes it possible to prevent a situation in which the electronic components are displaced and not mounted appropriately.

The temporary fixing film can be formed by applying a temporary fixing agent (material of the temporary fixing film) in such a manner as to cover the solder precoats and the antioxidation film. After the temporary fixing agent is applied, the temporary fixing agent may be dried and/or subjected to heat treatment as necessary. There is no limitation on the method for applying the temporary fixing agent, and the temporary fixing agent may be applied through screen printing in which a mask is used, or may be applied with use of a dispenser.

The temporary fixing film contains the activating agent and the second thermoplastic resin, and further contains other components as necessary. Rosins may be used as the second thermoplastic resin. Examples of the other components include a component that increases viscosity and a liquid component (a solvent or a dispersion medium). The activating agent is a substance that facilitates soldering. An activating agent that is used in a known solder flux may be used. Examples of the activating agent include abietic acid, succinic acid, glutaric acid, adipic acid, pimelic acid, suberic acid, azelaic acid, sebacic acid, dimer acid, propionic acid, 2,2-bis(hydroxymethyl)propionic acid, tartaric acid, malic acid, glycolic acid, diglycolic acid, thioglycolic acid, dithioglycolic acid, stearic acid, 12-hydroxystearic acid, palmitic acid, oleic acid, and modified acids of these acids. In addition to the above, examples of activating agents that have a reducing action include amines and halides. Examples of the component that increases viscosity include known components that are used as thickeners (or thixotropic agents), such as caster wax, an amide-based thixotropic agent, and a sorbitol-based thixotropic agent. The use of the temporary fixing film containing the activating agent makes it possible to suppress the occurrence of soldering defects by removing an oxide film from a terminal portion of an electronic component during the reflow step, for example.

Examples of the liquid component contained in the temporary fixing film include hexyl diglycol (boiling point: about 260° C.). It is possible to use a liquid component that has a boiling point higher than the melting point of the solder constituting the solder precoats. For example, it is possible to use, as the liquid component, an alcohol, a polyol, a glycol ether, or any other organic compound (e.g., a glycol, a ketone, a hydrocarbon, an ester, or a terpineol), each of which has a boiling point within a range from 230° C. to 320° C. Among these, substances that have a relatively high viscosity are preferably used.

Examples of modified rosins that can be used as the second thermoplastic resin include the above-described examples of modified rosins that can be used for the antioxidation film. The softening point of a rosin can be changed by modifying the rosin. The temporary fixing film may be formed using a solder flux that has a relatively high viscosity.

The viscosity of the temporary fixing film may be within a range from 20 to 200 Pa·s (e.g., 50 to 180 Pa·s). When the temporary fixing film has a viscosity of 20 Pa·s or more, the electronic components can be temporarily fixed stably. The viscosity of the temporary fixing film is particularly preferably 50 Pa·s or more in order to temporarily fix the electronic components more stably. The viscosity can be measured using a rheometer manufactured by Anton Paar GmbH and a cone having an angle of 1.993°. Note that the viscosity described above is measured at 25° C.

The softening point T1 (° C.) of the first thermoplastic resin is equal to or lower than the softening point T2 (° C.) of the second thermoplastic resin, and may be lower than T2. It can be considered that the antioxidation film starts to soften at the softening point T1 of the first thermoplastic resin. Likewise, it can be considered that the temporary fixing film starts to soften at the softening point T2 of the second thermoplastic resin. Therefore, the softening point T1 and the softening point T2 may be hereinafter described as the softening point of the antioxidation film and the softening point of the temporary fixing film, respectively. Note that softening points of rosins described in the present specification are values measured in accordance with a method described in JIS K 5902. Various rosins having different softening points are commercially available, and therefore, the softening points T1 and T2 can be easily adjusted using those rosins.

The first thermoplastic resin is typically a main component of the antioxidation film. The second thermoplastic resin is typically a main component of the temporary fixing film. Here, the term "main component" refers to a component whose content is the highest among contents of components other than a liquid component (a solvent or a dispersion medium). The main component typically accounts for 50 mass % or more of the components other than the liquid component. Note that each of the first thermoplastic resin and the second thermoplastic resin may be constituted of a plurality of thermoplastic resins. In the case where the first thermoplastic resin and the second thermoplastic resin are each constituted of a plurality of resins, softening points of all the resins satisfy the relationship: softening point T1 softening point T2. However, the antioxidation film and the temporary fixing film may contain, as a trace component (whose content in the film is 5 mass % or less, for example), a thermoplastic resin other than the first thermoplastic resin and the second thermoplastic resin.

The softening point T1 of the first thermoplastic resin may be within a range from 50° C. to 220° C. (e.g., 70° C. to 180° C.). The softening point T2 of the second thermoplastic resin may be within a range from 50° C. to 220° C. (e.g., 70° C. to 180° C.). The softening point T1 and the softening point T2 may satisfy a relationship: $0 \leq (T2-T1) \leq 65$. The value (T2−T1) may be within a range from 0 to 110 (° C.). In the above ranges, the value (T2−T1) may be larger than 0. Note that, as a matter of course, the softening point T2 of the temporary fixing film is lower than the melting point of the solder precoats.

In the case where the temporary fixing film contains a liquid component, it is preferable that both the first thermoplastic resin and the second thermoplastic resin dissolve in the liquid component of the temporary fixing film. In this case, the components of the antioxidation film and the temporary fixing film are miscible with each other when these films have softened. For example, it is preferable to use rosins as the first thermoplastic resin and the second thermoplastic resin and use a liquid component (e.g., hexyl diglycol) in which those rosins dissolve, as the liquid component of the temporary fixing film.

(Step (ii))

The step (ii) is a step of disposing a plurality of electronic components on the plurality of solder precoats via the antioxidation film and the temporary fixing film. There is no particular limitation on the method for disposing the electronic components, and a known method and a known device may be used. The plurality of electronic components may include an electronic component having a size equal to or smaller than the 0402 size specified in JIS. The present invention is particularly effective when such a minute electronic component is mounted. The electronic components are fixed by the temporary fixing film, and thus stably fixed on the substrate until the step (iii) is performed.

(Step (iii))

The step (iii) is a step of soldering the plurality of electronic components to the plurality of lands by melting the plurality of solder precoats. The step (iii) can be performed as a step that is commonly called a reflow step. In the reflow step, the substrate and the like (the substrate on which the electronic components are disposed) are heated until the solder precoats melt, and then cooled to solidify the molten solder. Through the step (iii), the substrate on which the electronic components are mounted is obtained. Inspection on soldering or the like may be performed after the step (iii) as necessary.

When the substrate on which the electronic components are disposed is heated in the step (iii), the antioxidation film softens first and thereafter the temporary fixing film softens. According to this configuration, it is possible to suppress the occurrence of a defect such as an electronic component being connected to a land other than a land to which the electronic component should be soldered, which defect occurs as a result of the electronic component moving while the substrate is heated. The shorter a distance between lands on which adjacent electronic components are disposed is, the higher the effect of suppressing the occurrence of a defect with this configuration becomes.

There is no particular limitation on the step (iii) as long as the plurality of electronic components can be soldered to the substrate, and a known reflow step may be used. For example, the step of heating the substrate and the like may include a preheating step. Alternatively, a configuration is also possible in which the step of heating the substrate and the like does not include a preheating step. In such a case, the substrate and the like may be heated such that the temperature of an upper surface of the substrate increases at a temperature rise rate higher than 2° C./second during a period for which the temperature of the upper surface of the substrate increases from 50° C. to the melting point of the solder precoats. That is, in this case, the temperature rise rate of the upper surface of the substrate does not become 2° C./second or less during the period for which the temperature of the upper surface of the substrate increases from 50°

C. to the melting point of the solder precoats. The temperature rise rate may be 3° C./second or more, or 4° C./second or more. The temperature rise rate may be 10° C./second or less (e.g., 8° C./second or less). When the temperature rise rate is 10° C./second or less, separation of interconnects and lands from a substrate portion can be suppressed. Note that the upper surface of the substrate is a surface on which the lands for placing the electronic components thereon are formed. The time it takes to perform the step (iii) can be significantly reduced by omitting the preheating step and adopting a high temperature rise rate (e.g., 4° C./second or more).

When the solder precoats are exposed to high temperatures for a long period of time, surfaces of the solder precoats are oxidized and soldering defects are likely to occur. When the above-described temperature rise rate is 4° C./second or more, oxidation of the surfaces of the solder precoats can be suppressed, and the occurrence of soldering defects can be suppressed. This effect is particularly noticeable when the plurality of electronic components include a minute electronic component. Here, the term "minute electronic component" refers to an electronic component having a planar shape in which the length of one side is 0.4 mm or less, for example. Such electronic components include electronic components having a size equal to or smaller than the 0402 size specified in JIS. In the present specification, the term "planar shape" refers to the shape of an electronic component as viewed from above the substrate in the state where the electronic component is mounted on the substrate.

The step (iii) can be performed using a reflow apparatus having a configuration that is the same as or similar to the configuration of a known reflow apparatus. In order to suppress oxidation of the surfaces of the solder precoats, the step (iii) may be performed in a nitrogen gas atmosphere in the reflow apparatus. However, even if the step (iii) is performed in an air atmosphere in the reflow apparatus, oxidation of the surfaces of the solder precoats can be suppressed in the case where the above-described temperature rise rate is 4° C./second or more. Accordingly, the step (iii) may be performed in an air atmosphere in the case where the above-described temperature rise rate is 4° C./second or more.

The melting point of the solder precoats varies according to the solder that is used. In the case of a commonly-used lead-free solder (solder that does not contain lead), the melting point is 200° C. or higher, for example. Accordingly, when the lead-free solder is used, the temperature of the upper surface of the substrate is increased to 200° C. or higher (e.g., 220° C. or higher, or 230° C. or higher) in the step (iii). An upper limit of the temperature of the upper surface of the substrate may be set to 250° C. or lower (e.g., 240° C. or lower, or 230° C. or lower) in view of an influence on the electronic components.

The shortest distance L between a first land on which one electronic component out of the plurality of electronic components is disposed and a second land on which an electronic component adjacent to the one electronic component is disposed may be 0.4 mm or less. The manufacturing method (M) is particularly effective when the shortest distance L is short. For example, the shortest distance L may be 0.03 mm or more, 0.05 mm or more, 0.1 mm or more, or 0.2 mm or more. The shortest distance L may be 0.4 mm or less, 0.3 mm or less, or 0.2 mm or less. However, the shortest distance L may be more than 0.4 mm. The shortest distance L may be within a range from 0.03 to 0.4 mm, a range from 0.05 to 0.4 mm, a range from 0.1 to 0.4 mm, or a range from 0.2 to 0.4 mm. The upper limit of these ranges may be changed to 0.2 mm or 0.3 mm unless the lower limit is equal to or higher than the upper limit.

The distance between the first land and the second land may be various values in an electronic-component-mounted substrate, and the smallest value among those values is the shortest distance L. Assume a substrate that includes: a portion in which the distance between a first land on which one electronic component is disposed and a second land on which an electronic component adjacent to the one electronic component is disposed is 0.4 mm or less; and a portion in which the distance between a first land on which another electronic component is disposed and a second land on which an electronic component adjacent to the other electronic component is disposed is more than 0.4 mm. In the case of this substrate, the shortest distance L is 0.4 mm or less.

The manufacturing method (M) may include a step (x) of forming the plurality of solder precoats and the antioxidation film on the plurality of lands before the step (i). There is no limitation on the method for forming the plurality of solder precoats, and a known method may be used.

The manufacturing method (M) may further include, after the step (x) and before the step (i), a step (y) of pressing the plurality of solder precoats and the antioxidation film from above the substrate to form cracks in the antioxidation film and flatten upper surfaces of the plurality of solder precoats.

The manufacturing method (M) may further include, after the step (x) and before the step (i), a step (z) of forming, in a case where at least one solder precoat has been formed inappropriately in the step (x) in such a manner as to short-circuit two adjacent lands, a notch in a portion of the inappropriately formed solder precoat, the portion being between and above the two lands.

The manufacturing method (M) may include either the step (y) or the step (z) or both the steps (y) and (z). In the case where the both steps are included, the step (z) may be performed before or after the step (y).

The following specifically describes examples of embodiments of the present invention with reference to the drawings. The following embodiments can be modified based on the above description. Also, matters described below may be applied to the above-described embodiment. Matters that are not essential to the embodiments of the present invention can be omitted. In the drawings referred to below, the scale of members may be changed in order to facilitate understanding. Also, in the drawings referred to below, hatching may be omitted in some members. Note that, in the drawings referred to below, only one electronic component is shown as an electronic component mounted on a substrate, but a plurality of electronic components are actually mounted on the substrate.

Embodiment 1

In Embodiment 1, an example of the manufacturing method (M) will be described. Steps included in the manufacturing method of Embodiment 1 are schematically shown in the cross-sectional views of FIGS. 1A and 1B.

First, as shown in FIG. 1A, a temporary fixing film 13 is formed in such a manner as to cover each of a plurality of solder precoats 11 and an antioxidation film 12 (step (i)). The solder precoats 11 are formed on lands 10b on a printed circuit board (substrate) 10. The printed circuit board 10 includes a plate-shaped substrate portion 10a and the lands 10b formed on a surface of the substrate portion 10a.

Figure 1B:
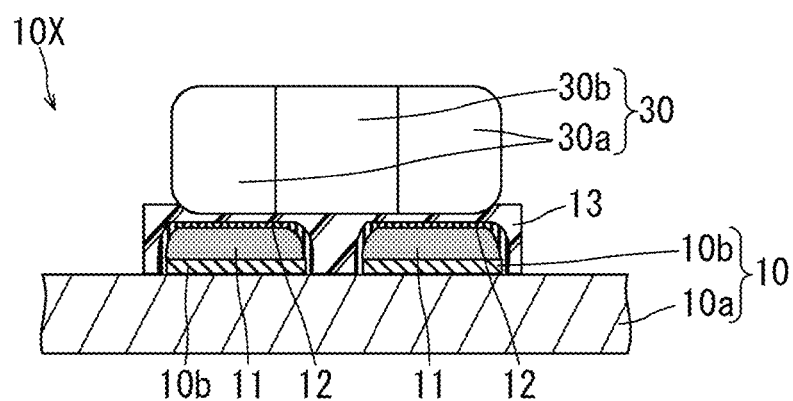
FIG. 1B is a cross-sectional view schematically showing a step following the step shown in FIG. 1A.

Next, a plurality of electronic components 30 are disposed on the plurality of solder precoats 11 via the antioxidation film 12 and the temporary fixing film 13 as shown in FIG. 1B (step (ii)). Thus, a substrate 10X on which the plurality of electronic components 30 are disposed is obtained. The illustrated example of the electronic components 30 includes two terminal portions 30a and an element portion 30b between the terminal portions 30a.

Figure 1C:
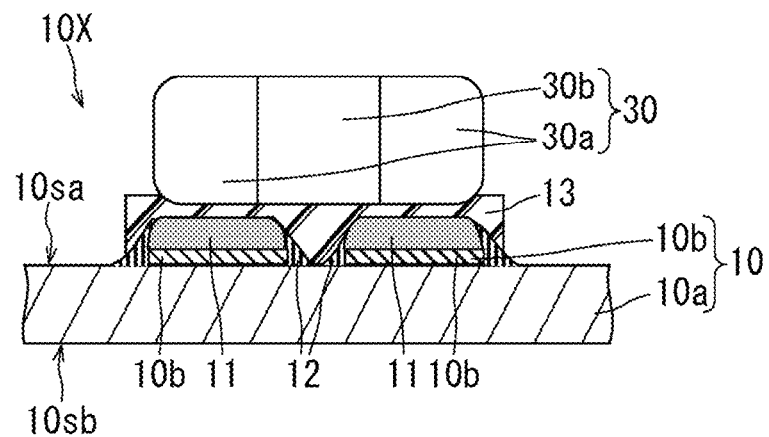
FIG. 1C is a cross-sectional view schematically showing a step following the step shown in FIG. 1B.

Next, the substrate 10X is introduced into a reflow apparatus and heating of the substrate 10X is started. The antioxidation film 12 softens earlier than the temporary fixing film 13. FIG. 1C shows a state where the antioxidation film 12 has softened and the temporary fixing film 13 has not softened. At this time, the softened antioxidation film 12 spreads. However, the temporary fixing film 13 has not softened and maintains a shape corresponding to shapes of the solder precoats 11. Therefore, even when the antioxidation film 12 softens, the electronic components 30 are kept from moving in a direction parallel to the surface of the printed circuit board 10.

Consequently, the occurrence of soldering defects is suppressed.

Figure 1D:
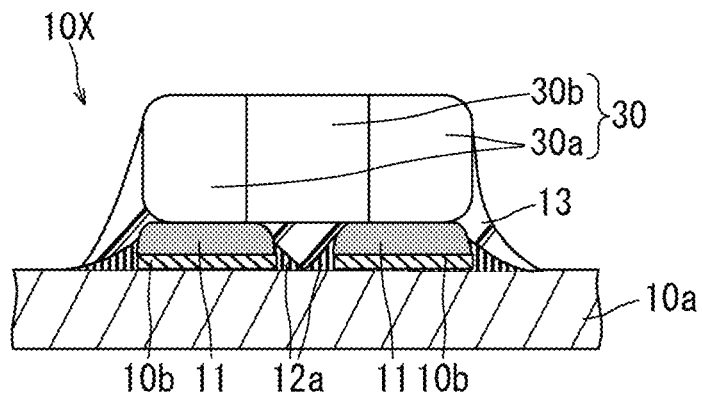
FIG. 1D is a cross-sectional view schematically showing a step following the step shown in FIG. 1C.

FIG. 1D shows a state where the substrate 10X has been further heated. In the state shown in FIG. 1D, the temporary fixing film 13 has also softened and the temporary fixing agent spreads along the surface of the electronic component 30. As a result, an oxide film on surfaces of the terminal portions 30a of the electronic component 30 is removed. Consequently, the occurrence of soldering defects is suppressed.

Figure 1E:
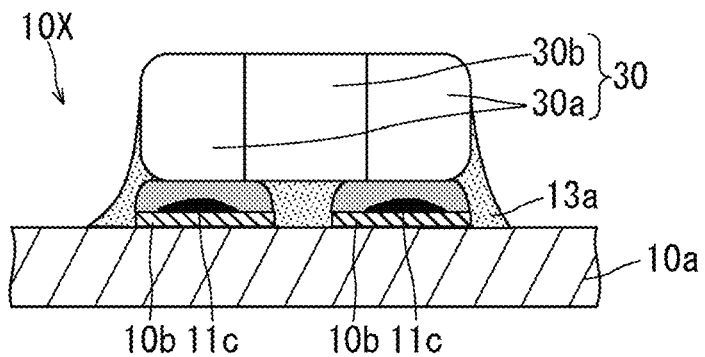
FIG. 1E is a cross-sectional view schematically showing a step following the step shown in FIG. 1D.

FIG. 1E shows a state where the substrate 10X has been further heated. In the state shown in FIG. 1E, portions of the solder precoats 11 have melted and molten cores 11b are formed on the lands 10b. Also, the components of the antioxidation film 12 and the temporary fixing film 13 are mixed with each other to be a mixture 13a.

Figure 1F:
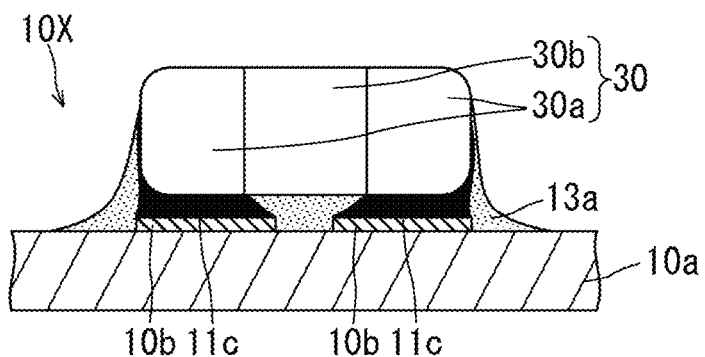
FIG. 1F is a cross-sectional view schematically showing a step following the step shown in FIG. 1E.
Figure 1G:
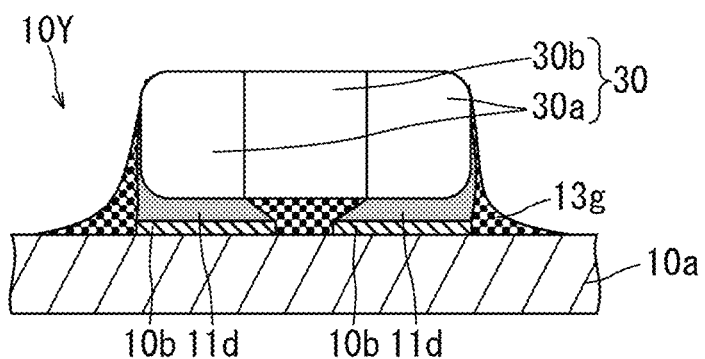
FIG. 1G is a cross-sectional view schematically showing a step following the step shown in FIG. 1F.

When the substrate 10X is further heated, the whole solder precoats 11 melt and form molten solder portions 11c as shown in FIG. 1F. Thereafter, the substrate 10X is cooled, and thus the molten solder is solidified and solder portions 11d are formed as shown in FIG. 1G. The electronic components 30 are soldered to the lands 10b via the solder portions 11d. The temporary fixing film 13 becomes a residue 13g. Thus, a substrate 10Y on which the electronic components 30 are mounted is obtained. The substrate 10Y is an electronic-component-mounted substrate.

As described above, the substrate 10X may be heated such that the temperature of an upper surface 10sa of the printed circuit board 10 is lower than the temperature of a lower surface 10sb of the printed circuit board 10. Also, the substrate 10X may be heated using either a method including the preheating step or a method not including the preheating step, as described above. Regarding the case where the preheating step is not performed, FIG. 2 shows an example of temperature profiles of the upper surface 10sa and the lower surface 10sb of the printed circuit board 10 in the step (iii).

Figure 2:
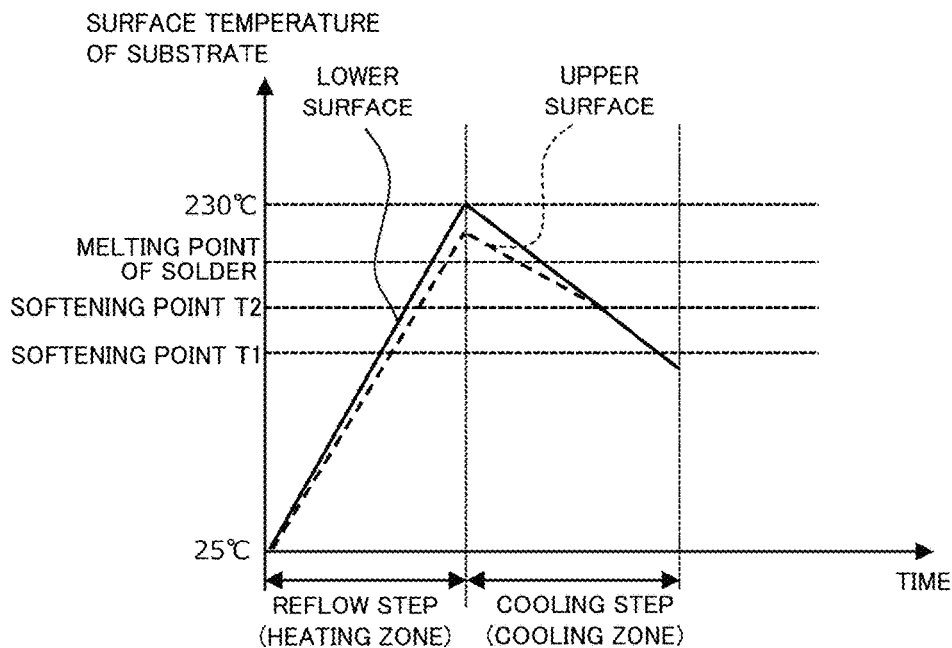
FIG. 2 is a diagram schematically showing an example of temperature profiles of surfaces of a substrate in a step (iii).

FIG. 2 shows an example in which the temperature of each surface of the substrate is increased from room temperature (25° C.) to the highest temperature at a constant temperature rise rate. In the example shown in FIG. 2, the temperature rise rate of the upper surface 10sa is 4° C./second or more. The temperature rise rate of the lower surface 10sb is higher than the temperature rise rate of the upper surface 10sa. The softening point T1 (° C.) of the first thermoplastic resin contained in the antioxidation film 12 is equal to or lower than the softening point T2 (° C.) of the second thermoplastic resin contained in the temporary fixing film 13. That is, the softening temperature of the antioxidation film 12 is equal to or lower than the softening temperature of the temporary fixing film 13. In the example shown in FIG. 2, a cooling step is performed in a cooling zone after the reflow step is finished in a heating zone.

Figure 3A:
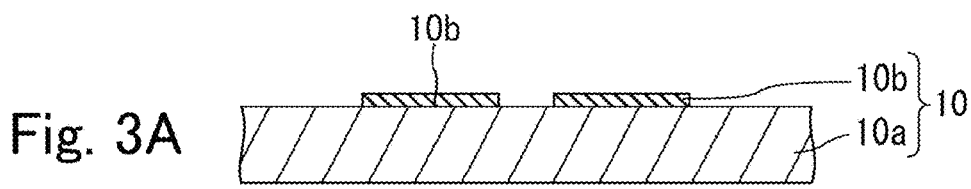
FIG. 3A is a cross-sectional view schematically showing a part of an example of a step of forming solder precoats.

The manufacturing method (M) according to the present invention may include the step (x) of forming the plurality of solder precoats 11 and the antioxidation film 12 on the plurality of lands 10b. FIGS. 3A to 3E schematically show an example of the step (x). First, the printed circuit board (substrate) 10 shown in FIG. 3A is prepared. The printed circuit board 10 includes the plate-shaped substrate portion 10a and the lands 10b formed on the surface of the substrate portion 10a. The lands 10b are connected to interconnects (not shown) on the substrate portion 10a as necessary.

Figure 3B:
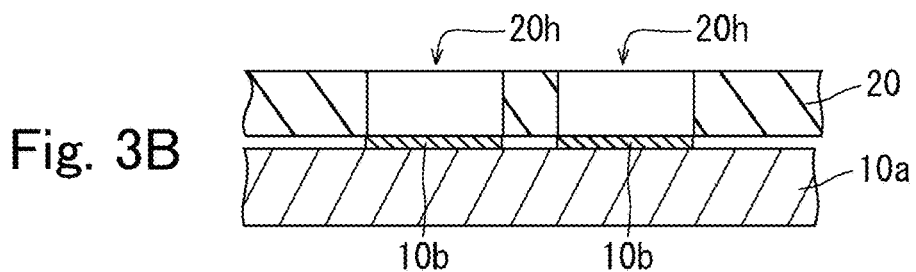
FIG. 3B is a cross-sectional view schematically showing a step following the step shown in FIG. 3A.
Figure 3C:
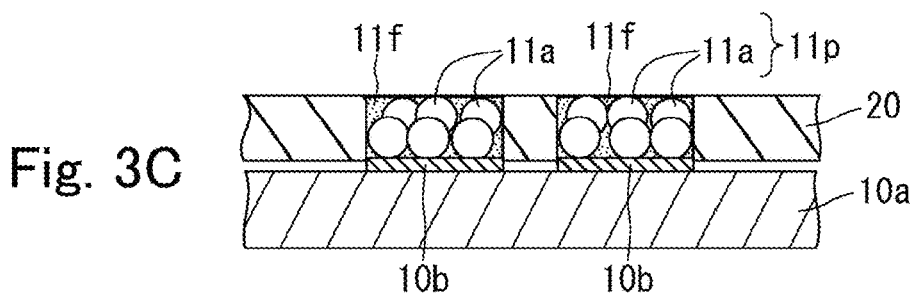
FIG. 3C is a cross-sectional view schematically showing a step following the step shown in FIG. 3B.

Next, a mask 20 is placed on the printed circuit board (substrate) 10 as shown in FIG. 3B. The mask 20 includes openings 20h at positions corresponding to the lands 10b to which a solder paste is to be applied. Next, a solder paste 11p is placed on the lands 10b by being applied to the lands 10b as shown in FIG. 3C. The solder paste 11p contains solder particles 11a and a flux 11f.

Figure 3D:
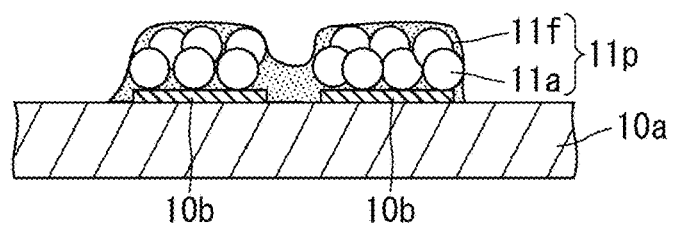
FIG. 3D is a cross-sectional view schematically showing a step following the step shown in FIG. 3C.
Figure 3E:
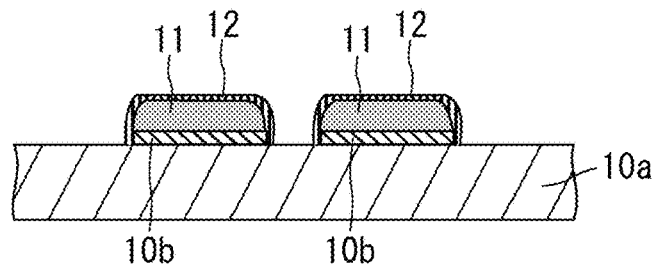
FIG. 3E is a cross-sectional view schematically showing a step following the step shown in FIG. 3D.

Next, the mask 20 is removed from the printed circuit board 10 as shown in FIG. 3D. Next, the printed circuit board 10 including the solder paste 11p placed thereon is heated to melt the solder particles 11a, and then the printed circuit board 10 is cooled. Thus, solder precoats 11 are formed on the lands 10b as shown in FIG. 3E. At this time, a residue of the flux 11f forms the antioxidation film 12. A thermoplastic resin contained in the flux 11f serves as the first thermoplastic resin contained in the antioxidation film 12.

Conventionally, it is thought that when a residue of the flux 11f is left, the residue causes the occurrence of soldering defects in the reflow step. Therefore, the remaining flux residue has been conventionally removed by cleaning. However, in the present embodiment, the flux residue is used as the antioxidation film 12 on the solder precoats 11. The antioxidation film 12 remains until just before the solder melts in the reflow step, and therefore, oxidation of the surfaces of the solder precoats 11 can be suppressed. Moreover, when the flux residue is used as the antioxidation film 12, it is possible to omit a step of removing the flux residue.

Figure 4A:
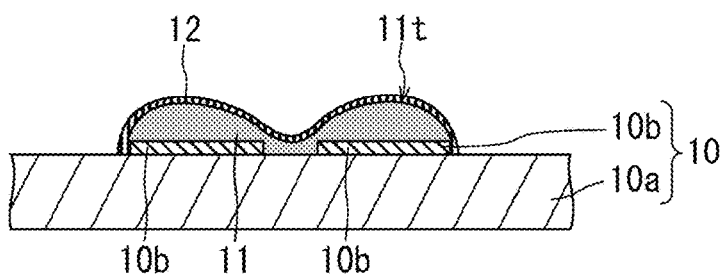
FIG. 4A is a cross-sectional view schematically showing a step in another example of the manufacturing method according to the present invention.
Figure 4B:
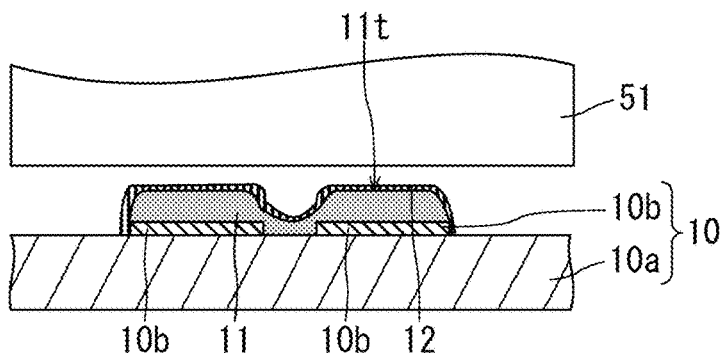
FIG. 4B is a cross-sectional view schematically showing a step following the step shown in FIG. 4A.

The manufacturing method (M) may include the step (y) and/or the step (z) described above, after the step (x) and before the step (i). FIGS. 4A and 4B show cross-sectional views of a step in an example of the case where the step (y) and the step (z) are performed after the step (x).

The step (z) is performed in a case where at least one solder precoat 11 has been formed inappropriately in such a manner as to short-circuit two adjacent lands 10b as shown in FIG. 4A. Note that, in the case where the step (z) is performed, an inspection step of inspecting whether or not solder precoats 11 have been formed appropriately is performed after the step (x) and before the step (z). The inspection step can be performed using a known method. For example, it is possible to detect a defect in solder precoats 11 by capturing an image of the printed circuit board 10 on which the solder precoats 11 have been formed, with a camera, and performing image processing on the captured image.

In the step (y), the plurality of solder precoats 11 and the antioxidation film 12 are pressed from above the printed circuit board 10 with use of a flattening tool 51 that has a flat pressing surface as shown in FIG. 4B (flattening step). Thus, cracks (not shown) are formed in the antioxidation film 12, upper surfaces 11t of the solder precoats are flattened, and thicknesses of the solder precoats 11 are reduced. When the electronic components 30 are downsized, the solder precoats 11 are also downsized. When the solder precoats 11 are downsized, the upper surfaces 11t of the solder precoats 11 may have hemispherical shapes under the influence of surface tension, and it may be difficult to stably dispose the electronic components 30. When the upper surfaces of the solder precoats 11 are flattened in the step (y), the electronic components 30 can be stably disposed. Also, when cracks are formed in the antioxidation film 12, mixing of a solvent contained in the temporary fixing film 13 and a solvent contained in the antioxidation film 12 is facilitated. Also, the antioxidation film 12 peels off and anew surface of solder metal appears, and therefore, connection between electrodes of the electronic component and the solder constituting the solder precoats is facilitated. The antioxidation film 12 is supplied immediately after the flattening step, and therefore, the new surface of solder metal is hardly oxidized.

Figure 4C:
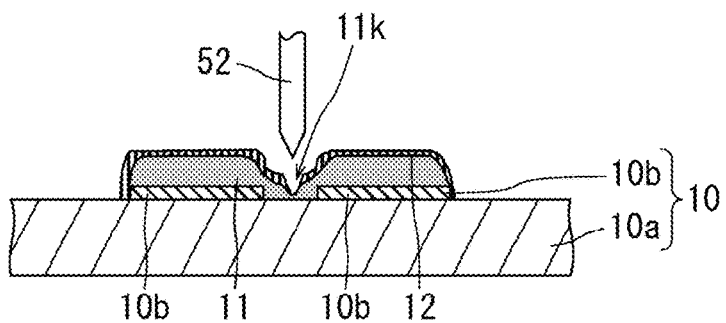
FIG. 4C is a cross-sectional view schematically showing a step following the step shown in FIG. 4B.

Next, the step (z) is performed. First, as shown in FIG. 4C, a notch ilk is formed in a portion of the inappropriately formed solder precoat 11, the portion being between and above the two lands 10b. The notch ilk can be formed by pricking the above-described portion of the solder precoat 11 with a tool 52 like a chisel as shown in FIG. 4C, for example.

Figure 4D:
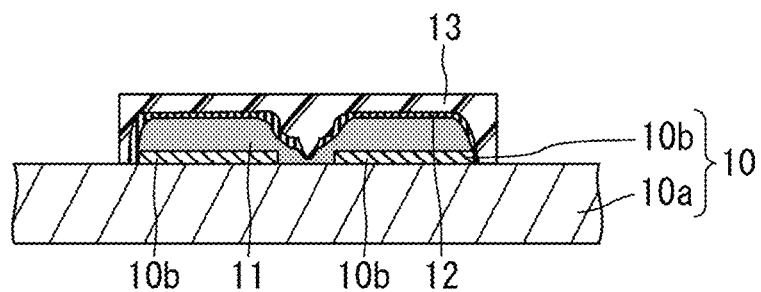
FIG. 4D is a cross-sectional view schematically showing a step following the step shown in FIG. 4C.

Thereafter, the electronic components 30 are mounted in the same manner as that shown in FIGS. 1A to 1G. Specifically, first, the temporary fixing film 13 is formed in such a manner as to cover the solder precoats 11 and the antioxidation film 12 as shown in FIG. 4D (step (i)).

Figure 4E:
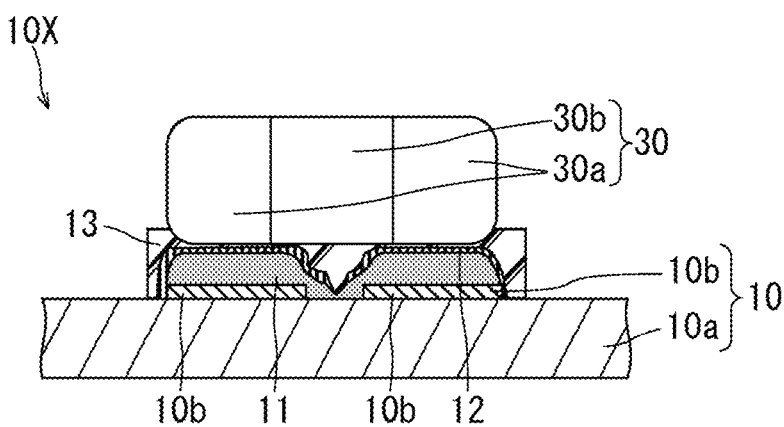
FIG. 4E is a cross-sectional view schematically showing a step following the step shown in FIG. 4D.

Next, the plurality of electronic components 30 are disposed on the plurality of solder precoats 11 via the antioxidation film 12 and the temporary fixing film 13 as shown in FIG. 4E (step (ii)). Thus, the substrate 10X on which the plurality of electronic components 30 are disposed is obtained.

Figure 4F:
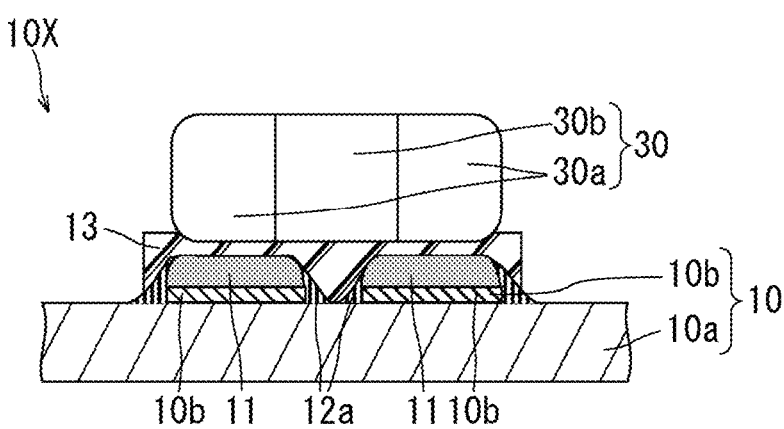
FIG. 4F is a cross-sectional view schematically showing a step following the step shown in FIG. 4E.
Figure 4G:
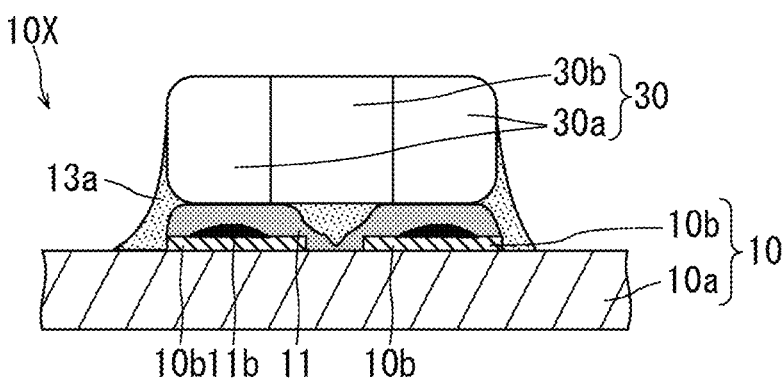
FIG. 4G is a cross-sectional view schematically showing a step following the step shown in FIG. 4F.
Figure 4H:
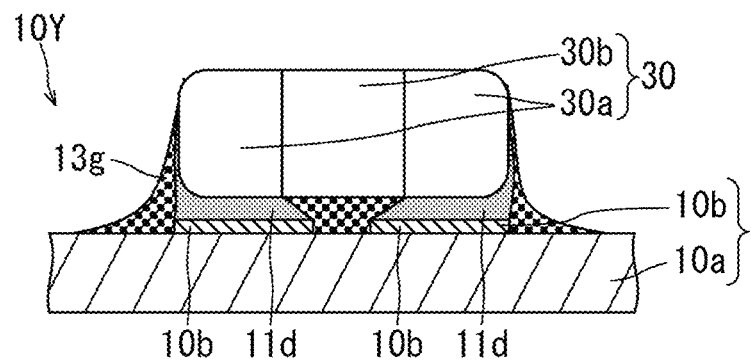
FIG. 4H is a cross-sectional view schematically showing a step following the step shown in FIG. 4G.

Next, the substrate 10X is heated to melt the solder precoats 11 and then the molten solder is solidified, and thus the electronic components 30 are mounted on the printed circuit board 10 (step (iii)). This step is schematically shown in the cross-sectional views of FIGS. 4F to 4H. FIG. 4F shows a state where the antioxidation film 12 has softened and spread. FIG. 4G shows a state where the temporary fixing film 13 has softened and the components of the antioxidation film 12 and the temporary fixing film 13 are mixed with each other to be a mixture 13a. Also, portions of the solder precoats 11 have melted and formed molten cores 11b. FIG. 4H shows a state where the molten solder has been solidified and formed solder portions 11d. The mixture 13a has become a residue 13g. Thus, the substrate 10Y on which the electronic components 30 are mounted is obtained. At the time when the solder precoats 11 melt, portions of the solder precoats 11 that have not melted are attracted toward the molten cores 11b, which have already melted, while melting. Therefore, the short circuit is finally solved as shown in FIG. 4H. When the notch 11k is formed, the solder precoat 11 between the two lands 10b is more likely to be attracted toward the molten cores 11b. Therefore, it becomes easier to solve the short circuit between the two lands.

EXAMPLES

The following describes the present invention more specifically using examples. In the following examples, electronic components were mounted with components of the antioxidation film and components of the temporary fixing film changed.

Experimental Example 1

In Experimental Example 1, solder precoats were formed on lands on a printed circuit board with use of a solder paste. A film of a flux residue formed on surfaces of the solder precoats was used as an antioxidation film. A mixture containing solder particles (90 mass %), a polymerized rosin (4.5 mass %, softening point: 140° C.), abietic acid (0.5 mass %), caster wax (0.5 mass %), and hexyl diglycol (4.5 mass %) was used as the solder paste. The hexyl diglycol is a liquid component (a solvent), the abietic acid is an activating agent, and the caster wax is a thixotropic agent (the same also applies to the following examples). Particles of solder, which was a SnAgCu alloy, were used as the solder particles. The main component of the antioxidation film (the film of the flux residue) formed using the solder paste is the polymerized rosin, and it can be considered that the antioxidation film starts to soften at 140° C.

Next, a temporary fixing film was formed in such a manner as to cover the solder precoats and the antioxidation film. A mixture containing a hydrogenated rosin (45 mass %, softening point: 75° C.), abietic acid (5 mass %), caster wax (5 mass %), and hexyl diglycol (45 mass %) was used as the material of the temporary fixing film. The main component of the temporary fixing film is the hydrogenated rosin, and it can be considered that the temporary fixing film starts to soften at 75° C.

Figure 5:
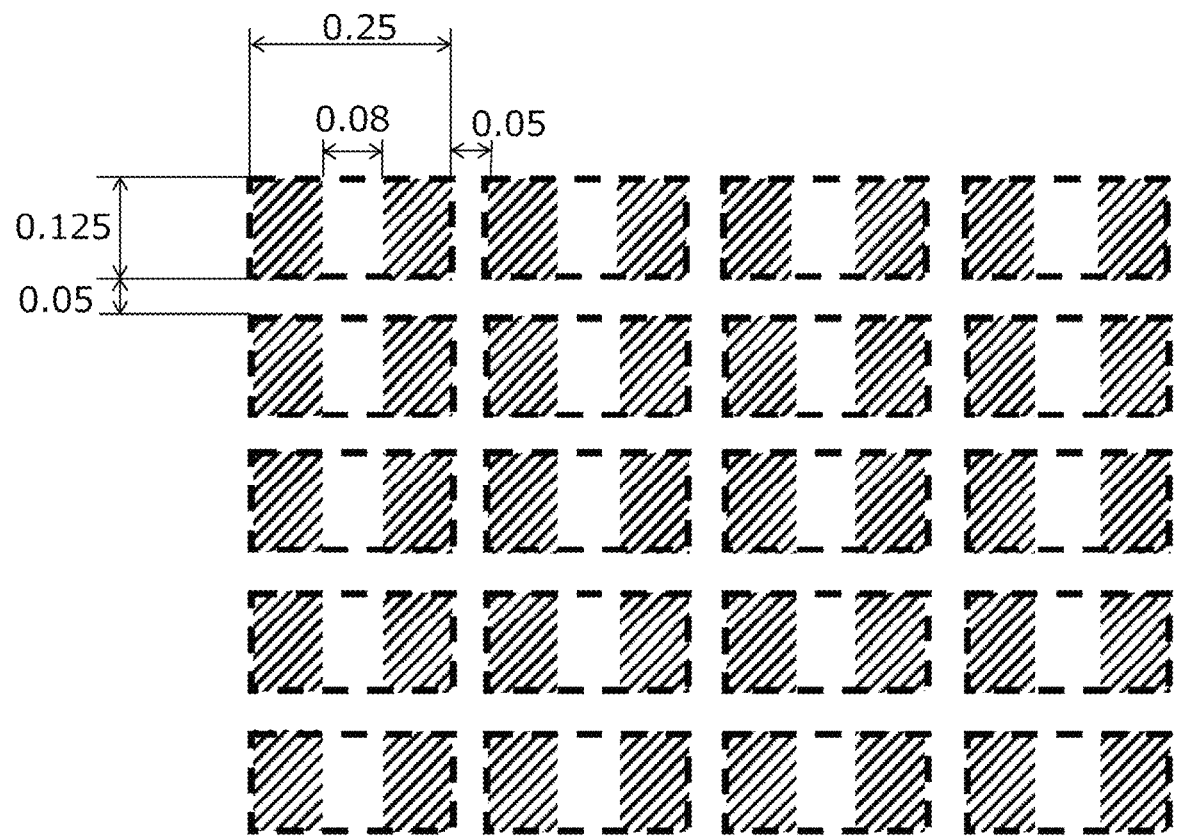
FIG. 5 is a top view schematically showing arrangement of lands and electronic components in Examples.

20 electronic components were disposed on the solder precoats on the obtained substrate via the antioxidation film and the temporary fixing film. Electronic components having the 0201 size (a planar shape having a size of 0.25 mm×0.125 mm) specified in JIS were used as the electronic components. FIG. 5 is a top view schematically showing arrangement of the lands and the electronic components on the printed circuit board. In FIG. 5, the lands are hatched, and dotted lines show positions at which the electronic components were disposed. FIG. 5 also shows sizes of the lands and the electronic components (unit: mm). As shown in FIG. 5, the shortest distance L between adjacent lands was 0.05 mm.

Next, the solder precoats were melted in a reflow apparatus to mount the electronic components on the printed circuit board. Thus, an electronic-component-mounted substrate of Experimental Example 1 was produced.

Experimental Examples 2 to 5

Solder pastes and materials of the temporary fixing film were prepared by mixing the components at the same ratios as those adopted in Experimental Example 1, with the polymerized rosin contained in the solder paste and/or the hydrogenated rosin contained in the temporary fixing film changed to other rosins. Electronic-component-mounted substrates of Experimental Examples 2 to 5 were produced in the same manner as in Experimental Example 1 with use of the prepared solder pastes and materials.

Whether or not the 20 electronic components were appropriately soldered to the lands was inspected for the electronic-component-mounted substrates of Experimental Examples 1 to 5. Specifically, the inspection was performed as to whether or not there was a defect (bridging), i.e., an electronic component being in contact with a land that was not a land to which the electronic component should have been soldered but was a land adjacent to that land. Table 1 shows rosins used in Experimental Examples 1 to 5, softening points of the rosins, and inspection results. Defect percentages shown in Table 1 indicate percentages of electronic components for which bridging occurred, out of the 20 electronic components.

TABLE 1

| Experimental example | Main component of antioxidation film | | Main component of temporary fixing film | | Defect percentage (%) |
|---|---|---|---|---|---|
| | Type | Softening point T1 (° C.) | Type | Softening point T2 (° C.) | |
| 1 | Polymerized rosin | 140 | Hydrogenated rosin | 75 | 25 |
| 2 | Polymerized rosin | 140 | Acrylated rosin hydride | 128 | 15 |
| 3 | Hydrogenated rosin | 75 | Polymerized rosin | 140 | 0 |
| 4 | Acrylated rosin hydride | 128 | Polymerized rosin | 140 | 0 |
| 5 | Polymerized rosin | 140 | Polymerized rosin | 140 | 0 |

As shown in Table 1, bridging did not occur in Experimental Examples 3 to 5, in which the softening point T1 was equal to or lower than the softening point T2. On the other hand, bridging occurred in Experimental Examples 1 and 2, in which the softening point T1 was higher than the softening point T2.

INDUSTRIAL APPLICABILITY

The present invention is applicable to a method for manufacturing an electronic-component-mounted substrate.

Although the present invention has been described in terms of the presently preferred embodiments, such a disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications that fall within the true spirit and scope of the present invention.

REFERENCE SIGNS LIST

10: printed circuit board (substrate)
10X, 10Y: substrate
10b: land
10sa: upper surface
10sb: lower surface
11: solder precoat
11a: solder particle
11c, 11d: solder
11f: flux
11k: notch
11p: solder paste
11t: upper surface
12: antioxidation film
13: temporary fixing film
30: electronic component

What is claimed is:

1. A method for manufacturing an electronic-component-mounted substrate, the method comprising:

a step (i) of forming a temporary fixing film in such a manner as to cover a plurality of solder precoats formed on a plurality of lands on a substrate and an antioxidation film formed in such a manner as to cover each of the plurality of solder precoats;

a step (ii) of disposing a plurality of electronic components on the plurality of solder precoats via the antioxidation film and the temporary fixing film; and a step (iii) of soldering the plurality of electronic components to the plurality of lands by melting the plurality of solder precoats, wherein the antioxidation film contains a first thermoplastic resin, the temporary fixing film contains an activating agent and a second thermoplastic resin, a softening point of the first thermoplastic resin is lower than a softening point of the second thermoplastic resin, the method further comprising, before the step (i), a step (x) of forming the plurality of solder precoats and the antioxidation film on the plurality of lands, the antioxidation film is a residue formed on a surface of the solder precoats when the plurality of solder precoats are formed in the step (x).

2. The method according to claim 1, wherein a shortest distance between a first land on which one electronic component out of the plurality of electronic components is disposed and a second land on which an electronic component adjacent to the one electronic component is disposed is 0.4 mm or less.

3. The method according to claim 1, further comprising, after the step (x) and before the step (i), a step (y) of pressing the plurality of solder precoats and the antioxidation film from above the substrate to form cracks in the antioxidation film and flatten upper surfaces of the plurality of solder precoats.

4. The method according to claim 1, further comprising, after the step (x) and before the step (i).

a step (z) of forming a notch in a portion of at least one of the solder precoats formed in such a manner as to short-circuit two adjacent lands in the step (x), the portion being between and above the two adjacent lands.

* * * * *